United States Patent
Asou

(10) Patent No.: US 7,727,895 B2
(45) Date of Patent: Jun. 1, 2010

(54) SUBSTRATE PROCESSING SYSTEM AND SUBSTRATE PROCESSING METHOD

(75) Inventor: Yutaka Asou, Ozu-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 374 days.

(21) Appl. No.: 11/693,244

(22) Filed: Mar. 29, 2007

(65) Prior Publication Data

US 2008/0032500 A1 Feb. 7, 2008

(30) Foreign Application Priority Data

Mar. 30, 2006 (JP) .............................. 2006-094692

(51) Int. Cl.
*H01L 21/311* (2006.01)
(52) U.S. Cl. .................. 438/698; 438/760; 118/64; 257/E21.026
(58) Field of Classification Search ................ 438/653, 438/632, 646, 698, 760; 118/64; 257/E21.026
See application file for complete search history.

(56) References Cited

U.S. PATENT DOCUMENTS 5,411,076 A * 5/1995 Matsunaga et al. ......... 165/80.2
5,877,078 A * 3/1999 Yanagida ................... 438/612
6,270,948 B1 * 8/2001 Sato et al. ................... 430/314
7,060,623 B2 * 6/2006 Kido ........................... 438/698
2004/0126713 A1   7/2004 Shiraishi et al.

FOREIGN PATENT DOCUMENTS

| JP | 2002-334830 | 11/2002 |
| JP | 2003-158054 | 5/2003 |
| JP | 2005-64277 | 3/2005 |
| JP | 2005-108904 | 4/2005 |

* cited by examiner

*Primary Examiner*—Khiem D Nguyen
(74) *Attorney, Agent, or Firm*—Oblon, Spivak, McClelland, Maier & Neustadt, L.L.P.

(57) ABSTRACT

Disclosed is a substrate processing method that dissolves and deforms a photoresist film having a first pattern formed on a substrate to reshape the resist film into a second pattern During the reflow process, an atmosphere of a thinner vapor-containing gas is established in a processing chamber. A substrate is placed on a temperature adjusting plate. The target temperature of the temperature adjusting plate is set and controlled by a control unit, and the temperature of the temperature adjusting plate is controlled by a temperature regulator based on the target temperature set by the control unit The control unit set and controls the target temperature so that it meets the following requirement: the atmospheric temperature≦the target temperature≦(the atmospheric temperature+2° C.). Due to the above, the reflowing of the resist can be performed stably, while achieving a satisfactory reflow rate although it is somewhat low.

1 Claim, 8 Drawing Sheets

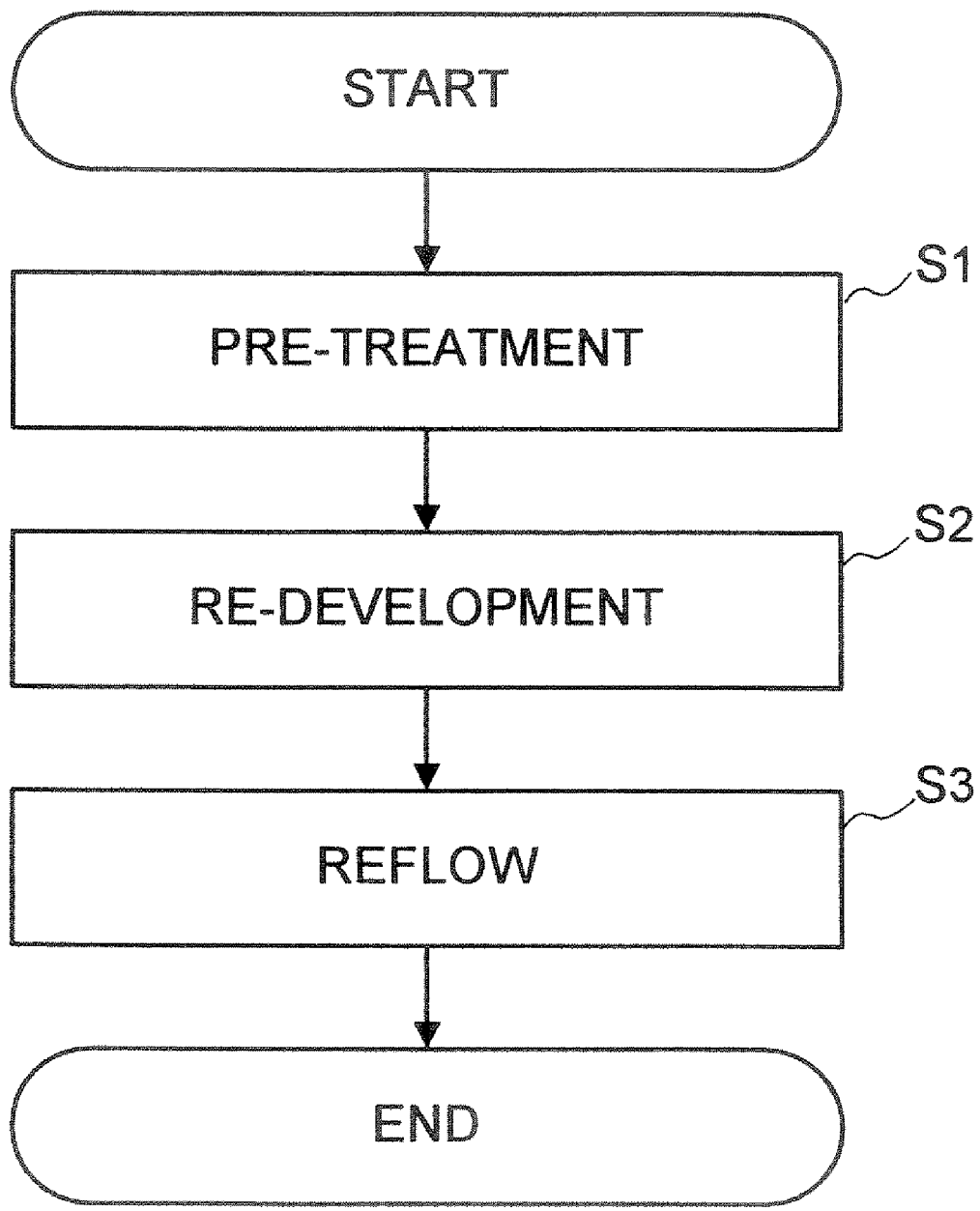
F I G. 3

SUBSTRATE PROCESSING SYSTEM AND SUBSTRATE PROCESSING METHOD

TECHNICAL FIELD

The present invention relates to a substrate processing system and a substrate processing method for dissolving a resist film, having been made by photolithography and used as an etch mask, to reflow the resist film so as to reshape the same into a new pattern.

BACKGROUND ART

In amorphous silicon TFT (thin film transistor) forming processes included in an LCD (liquid crystal display) fabrication, an etching process must be carried out for plural times. Thus, with the conventional art, a photolithography process including an exposing process and a developing process is carried out for plural times corresponding to the number of the etching processes. Different coating-and-developing apparatuses and exposure apparatuses are required for forming different patterns for respective etching processes in a TFT forming process, and the total system cost is thus expensive.

As one solution of the above problem, a reflow process, which dissolves and deforms a resist film of a first pattern once used as an etch mask to reshape the same into a new, second pattern, attracts attention in these days. With the use of the reflow process, it is not necessary for forming the second resist pattern to perform processes employing a coating-and-developing apparatus and an exposure apparatus. The reflow process not only reduces the total system cost but also improves the production efficiency.

A series of processes for formation of an amorphous silicon TFT including a reflow process will be described with reference to FIG. 10. As shown in FIG. 6(a), on a gate electrode 201 formed on a glass substrate 200, an insulating layer 202, an Si-layer 203 composed of an a-Si layer (i.e., non-doped amorphous Si layer) 203a and an n$^+$a-Si layer (i.e., phosphor-doped amorphous Si layer) 203b, and a metal layer 205 for forming drain and source electrodes are stacked in that order.

Then, in order to etch the metal layer 205, by a photolithography process, a resist film 206 is formed on the metal layer 205 and a first pattern is formed in the resist film 206 through an exposing step and a developing step. A half exposing technique is used in the exposing step so as to obtain the resist film 206 having thickness distribution (i.e., the resist film 206 has thick portions and thin portions.). The half exposing technique employs a half-tone mask having light-transmittance distribution. The half exposing technique is described in U.S.2004126713A1 (JP2005-108904A), for example. The resist film 206 having the first pattern is used as an etch mask for etching the metal layer 205, and portions of the metal layer 205 which are not covered with the mask are etched and removed, as shown in FIG. 6(b).

Altered layer 207 is formed in the surface region the resist film 206 due to application of a wet etching liquid used for etching the metal layer 205. As a pre-treatment of a reflow process, the altered layer 207 is removed by supplying thereto an alkaline solution, as shown in FIG. 6(c).

Then, as shown in FIG. 6(d), portions of the resist film 206 which are not necessary for a second etching process (i.e., the thin portions of the resist film 206) are removed by re-developing process, while portions of the resist film 206 near targets Tg (i.e., the thick portions of the resist film 206) remain.

Then, the remaining resist film 206 as shown in FIG. 6(d) is exposed to a solvent vapor-containing atmosphere. Thereby, the resist film 206 dissolves and diffuses (i.e., reflow) to move onto the targets Tg to cover the same. Thus, the resist film 206 is reshaped into a second pattern, in other words, a second resist pattern is formed. Then, the Si layer 203 is etched by using the metal layer 205 and the resist film 206 as masks, as shown in FIG. 7(a); and the resist film 206 is removed, as shown in FIG. 7(b). Thereafter, the n$^+$a-Si layer 203 in channel regions is etched so that a TFT structure is formed, as shown in FIG. 7(c).

In the foregoing reflow process, the substrate is placed on the temperature adjusting plate whose temperature is set to a predetermined constant value, and the substrate whose temperature is adjusted by the temperature adjusting plate is exposed to a solvent atmosphere such as a thinner gas atmosphere that dissolves the photoresist and reshapes it into a new pattern.

The foregoing reflow process, however, has a problem that it is difficult to appropriately reflow the resist film. That is, depending on the process conditions of the reflow process, the resist film, in some cases, reflows excessively to spread wider than desired so that the targets to be masked are not sufficiently covered by the resist film, or the resist film, in some cases, reflows slowly so that sufficient process efficiency can not be achieved.

SUMMARY OF THE INVENTION

The object of the present invention is to provide a technique for reflowing the resist film by which the targets to be masked can be covered by the re-flown resist film while sufficient process efficiency can be achieved The present inventor focused particular attention on the relationship between the substrate temperature and the temperature of the solvent atmosphere, studied it carefully, and finally found the relationship shown in FIG. 8. As shown in FIG. 8, in a case where the substrate temperature (24° C.) is lower than the temperature of the solvent atmosphere, the greater the difference between those temperatures is, the larger the amount of diffusion of the photoresist is. Note that the term "the amount of diffusion of the photoresist" is defined by the expression "((Resist Width After Reflow minus Resist Width Before Reflow)/2). The inventor considers that this relationship is resulted from the fact that the condensation of the solvent gas on the substrate surface is more likely to occur when the temperature of the solvent atmosphere minus the substrate temperature is larger.

FIG. 8 also shows that, in a case where the substrate temperature (24° C.) is equal to or higher than the temperature of the solvent atmosphere, if the substrate temperature is higher than the atmospheric temperature by 0° C. to 2° C., the amount of diffusion of the photoresist is 2.43 µm to 0.54 µm which is somewhat small but is satisfactory; if the substrate temperature is higher than the temperature of the solvent atmosphere by more than 2° C., the amount of diffusion of the photoresist is changed little according to the increase of the difference between the substrate temperature and the temperature of the solvent atmosphere.

The relationship shown in FIG. 8 means that, if the substrate temperature is considerably lower than the temperature of the solvent atmosphere, the photoresist dissolving rate is excessively large and thus the amount of diffusion of the photoresist is excessively large. In this case, the targets to be masked can not sufficiently be covered by the reflown photoresist film. On the contrary, if substrate temperature is higher than the temperature of the solvent atmosphere by more than 2° C., the dissolving of the photoresist hardly progresses. In this case, a considerably long time is required for the reflow process, resulting in reduction in the production efficiency.

The inventor also found that, if the substrate temperature is set to be lower than the temperature of the solvent atmosphere, the substrate temperature changes during the reflow process as shown in the graph of FIG. 9, and thus in-plane uniformity of the substrate temperature is deteriorated. In this case, the amount of diffusion of the photoresist varies by site on the surface of the substrate, and thus in-plane uniformity of the resist film thickness is deteriorated. This may cause defects in the resultant circuits such as disconnections or short-circuiting.

The present invention has been made in view of the foregoing outputs of the present inventor's study, and thus the present invention provides, in a first aspect thereof, a substrate processing apparatus that dissolves and deforms a photoresist film having a first pattern formed on a substrate to reshape the resist film into a second pattern, the apparatus including: a processing chamber; a temperature adjusting plate arranged in the processing chamber, the temperature adjusting plate having a substrate supporting surface on which a substrate is to be placed; a temperature regulator adapted to control a temperature of the substrate supporting surface to coincide with a target temperature of the substrate supporting surface so as to control a temperature of the substrate; a solvent supply system adapted to supply an atmosphere containing a solvent, the solvent having an ability to dissolve a photoresist film; an atmospheric temperature sensor adapted to detect an atmospheric temperature in the processing chamber; and a control unit adapted to receive a detection signal expressing an atmospheric temperature in the processing chamber detected by the atmospheric temperature sensor, and adapted to set the target temperature of the substrate supporting surface, the control unit being configured to compare the target temperature which is being set at that time with the atmospheric temperature detected by the atmospheric temperature sensor and controls the target temperature based on a comparison result.

The present invention also provides, in a second aspect thereof, a substrate processing method that dissolves and deforms a photoresist film having a first pattern formed on a substrate to reshape the resist film into a second pattern, the method including: placing a substrate on a substrate supporting surface of a temperature adjusting plate disposed in a processing chamber; adjusting a temperature of the substrate supporting surface to coincide with a target temperature; supplying an atmosphere containing a solvent having an ability to dissolve a photoresist film; detecting an atmospheric temperature in the processing chamber; comparing the target temperature which is being set at that time with the atmospheric temperature thus detected; and controls the target temperature based on a comparison result.

Preferably, the target temperature is controlled so as to satisfy the following condition: the atmospheric temperature≦the target temperature≦(the atmospheric temperature+2° C.).

BRIEF DESCRIPTION OF THE DRAWINGS

FIG. 3 is a flowchart showing processes performed in the reflow pattern forming apparatus shown in FIG. 1;

DESCRIPTION OF PREFERRED EMBODIMENTS

Figure 1:
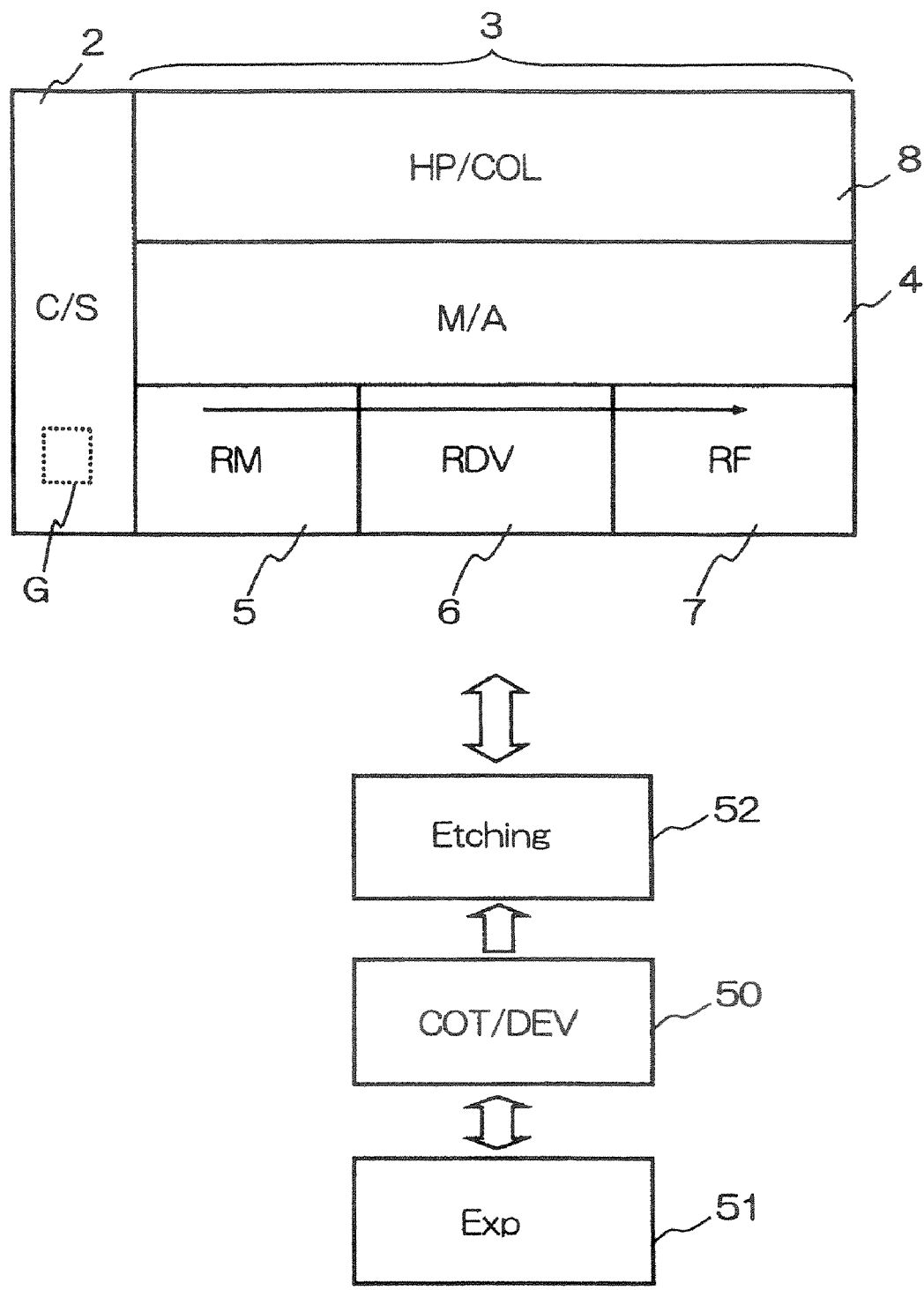
FIG. 1 is a schematic diagram showing the planar arrangement of a reflow pattern forming apparatus including a reflow unit that performs a reflow process according to the present invention.

Preferred embodiments of the present invention will be described with reference to the attached drawings. As shown in FIG. 1, a reflow pattern forming apparatus 1, a coating-and-developing apparatus (COT/DEV) 50, an exposure apparatus (Exp) 51, and an etching apparatus (Etching) 52 are provided in a factory. In a TFT fabrication, a resist (photoresist) film of a first pattern is formed on a substrate G by using the coating-and-developing apparatus 50 and the exposure apparatus (Exp) employing a photolithography process. Then, the substrate G is subjected to an etching process in the etching apparatus 52. Thereafter, the substrate G is transferred to the reflow pattern forming apparatus 1, in which the substrate G having the resist film of the first pattern is subjected to a reflow process so that the resist film is reshaped into a second pattern.

The reflow pattern forming apparatus 1 is provided with a cassette station (C/S) 2, to and from which a cassette holding therein plural substrates G is delivered from and to an external apparatus (e.g., the etching apparatus 52), and at which a substrate G is loaded and unloaded into and from a cassette.

A substrate processing block 3 is connected to the cassette station 2. Extending in the center portion of the substrate processing block 3 is a substrate transfer unit 4, in which a substrate transfer arm (not shown) is arranged to load and unload a substrate G into and from respective substrate processing units arranged on both sides of the substrate transfer unit 4 so as to transfer the substrate G between the substrate processing units.

The substrate processing block 3 includes, as the substrate processing units, a remover unit (RM) 5, a re-development unit (RDV) 6, and a reflow unit (RF) 7, which are arrayed in that order on the right side of the substrate transfer unit 4 along the substrate transfer direction as indicated by an arrow. A thermal treatment unit (HP/COL) 3 having plural hot plates and cooling plates is arranged on the left side of the substrate transfer unit 4. The task of the remover unit 5 is to perform a pre-treatment that removes an altered layer of a resist film. The task of the re-development unit 6 is to re-develop the resist film to remove therefrom unnecessary portion thereof. The task of the reflow unit 7 is to dissolve and deform the resist film having the first pattern so as to reshape the same into the second pattern, which will be described in detail hereinafter.

Figure 2:
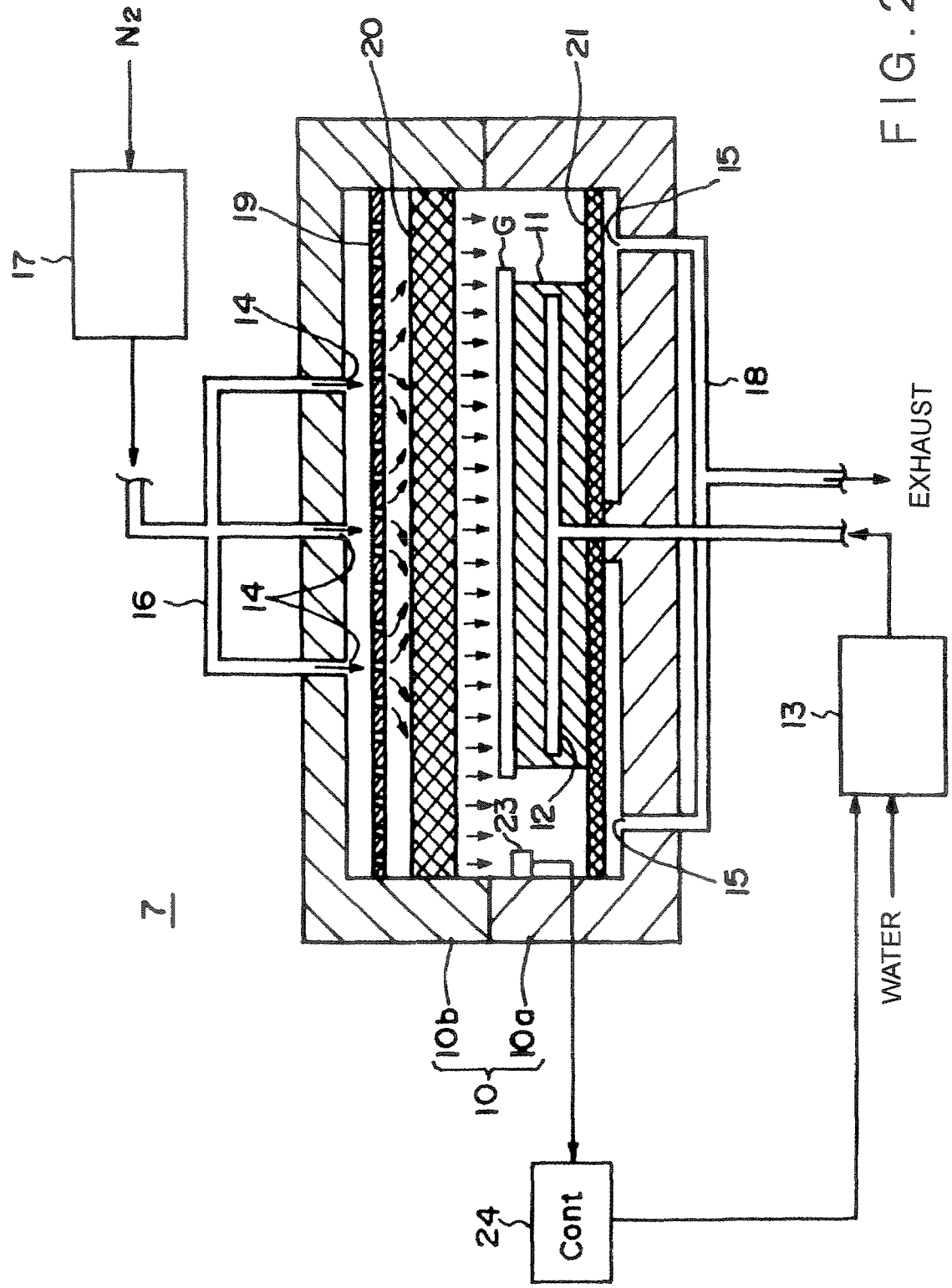
FIG. 2 is a cross-sectional view schematically showing the structure of the reflow unit in FIG. 1 in one embodiment of the present invention.

As shown in FIG. 2, the reflow unit 7 includes a processing chamber 10 having a base part 10a and an upper part 10b detachably engaged with the base part 10a to form a closed processing space.

At the center portion of the interior space of the processing chamber 10, a temperature adjusting plate 11 is disposed. The temperature adjusting plate 11 has a substrate support surface (i.e., the upper surface thereof) to support a substrate G thereon. A temperature control water passage 12 extends through the temperature adjusting plate 11. The temperature control water passage 12 is connected to a temperature regulator 13. Water is supplied into the temperature regulator 13, in which the temperature of the water is adjusted, and then the water is supplied into the temperature control water passage 12 in the temperature adjusting plate 11, thereby the temperature of the substrate support surface of the temperature adjusting plate 11 can be controlled at a target value, and the temperature of the substrate can be controlled at a desired value.

A thinner vapor-containing gas flow flowing downwardly in the processing chamber 10 is formed by a solvent atmosphere supply system, which is composed of: plural gas supply ports 14 and plural gas discharge ports 15 both opening into the processing chamber 10; and gas supply pipes 16, a solvent concentration adjusting device 17, and gas discharge pipes 18 disposed outside the processing chamber 10. To be specific, a thinner vapor-containing gas, i.e. an atmosphere containing a solvent, is supplied into the processing chamber 10 from the gas supply ports 14 provided in the top portion of the upper part 10b of the processing chamber 10, and the thinner vapor-containing gas thus supplied is discharged from the processing chamber 10 from the gas discharge ports 15 provided in the bottom portion of the base part 10a of the processing chamber 10.

The gas supply ports 14 are connected to the gas supply pipes 16, into which a thinner-containing gas whose thinner concentration is adjusted to a value in a range of 50 to 100 vol % is supplied from the solvent concentration adjusting device 17. $N_2$ gas is supplied into the solvent concentration adjusting device 17, and is mixed with a thinner vapor, so that a thinner vapor-containing gas, i.e., an $N_2$ gas diluted thinner vapor, may be supplied into the processing chamber 10 through the gas supply pipes 16 and the gas supply ports 14. On the other hand, the gas discharge pipes 18 are connected to the gas discharge ports 15 to discharge the atmosphere in the processing chamber 10.

The processing chamber 10 is further provided therein with: a diffusion plate 19 having plural holes that diffuses the thinner vapor-containing gas supplied through the gas supply ports 14 into the processing chamber 10; an equalizing plate 20 that equalizes the distribution of the flowing direction of the thinner vapor-containing gas having been diffused by the diffusion plate 19; and a flow rectifying plate 21 that rectifies a gas flow flowing toward the gas discharge ports 15.

An atmospheric temperature sensor 23 is disposed in the chamber 10 to detect the atmospheric temperature in the chamber 10. The detection result of the atmospheric temperature sensor 23 is output to a control unit 24, which controls the temperature regulator 13. The control unit 24 controls the temperature regulator 13 to control the temperature of the temperature adjusting water supplied through the temperature regulator 13 to the temperature adjusting plate 11.

Figure 6:
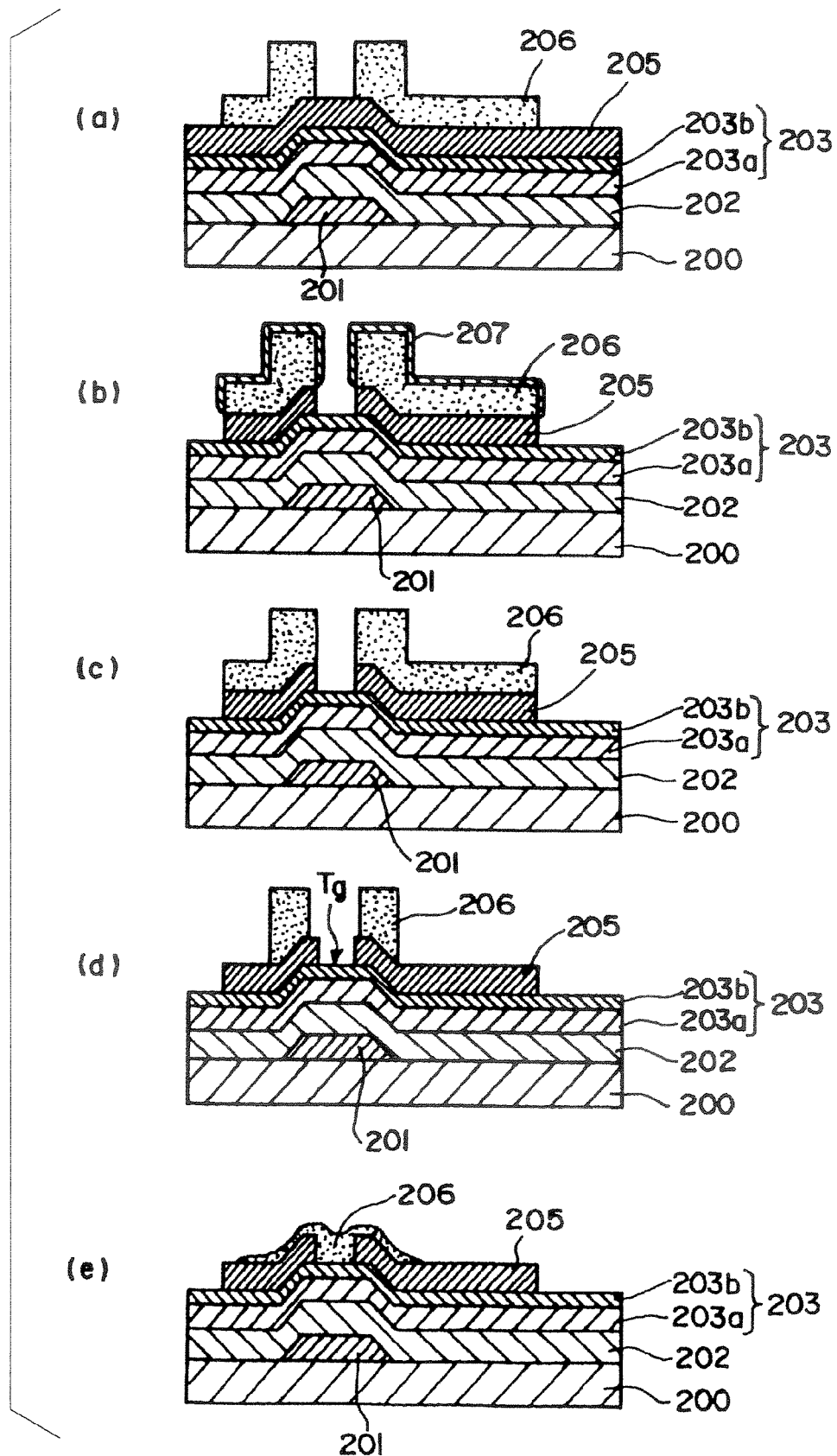
FIG. 6 shows cross-sectional views of a substrate for explaining a thin film transistor (TFT) fabricating processes including a reflow process.
Figure 7:
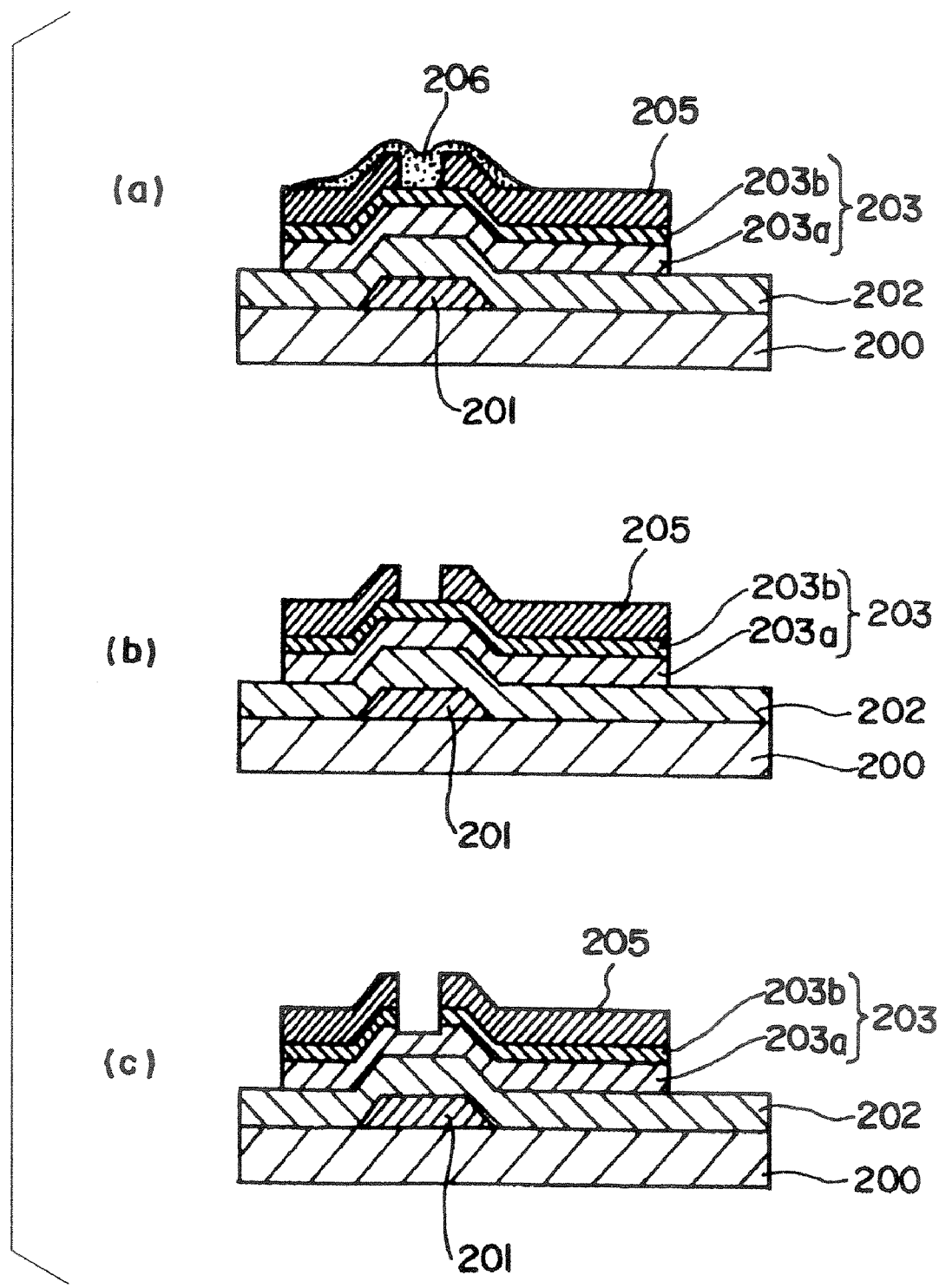
FIG. 7 shows cross-sectional views of the substrate for explaining the TFT fabricating processes succeeding the processes shown in FIG. 6.
Figure 8:
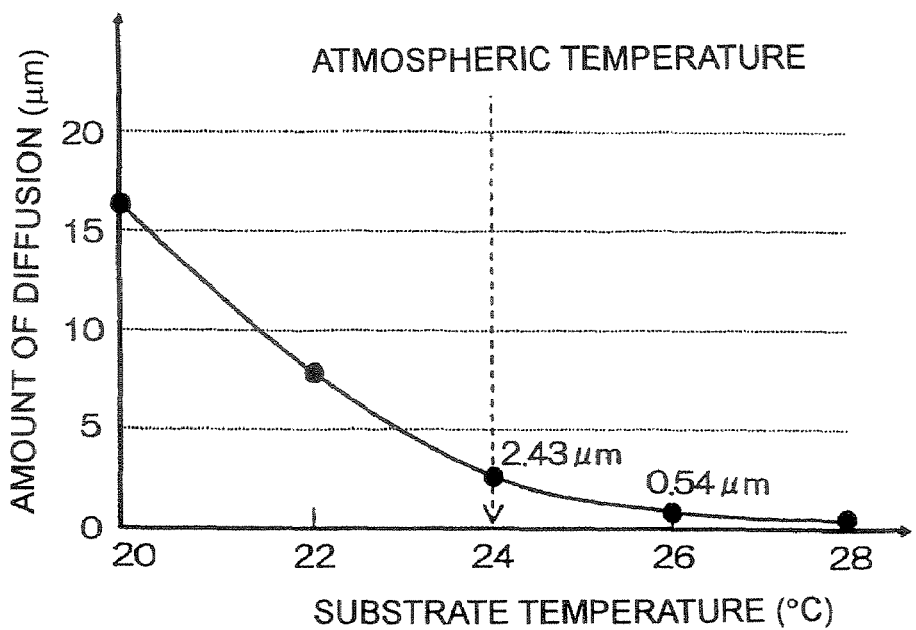
FIG. 8 is graph showing the relationship between a substrate temperature and an amount of diffusion of a photoresist.
Figure 9:
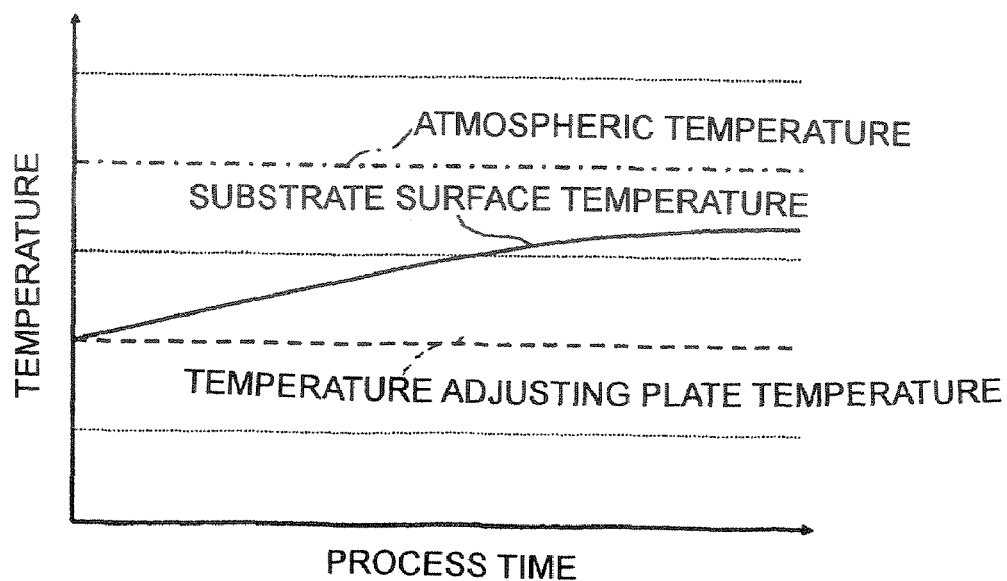
FIG. 9 is a graph showing the change in a substrate surface temperature with time in connection with the atmospheric temperature in a chamber and a temperature of a temperature adjusting plate.

Next, the operation of the reflow pattern forming apparatus 1 will be described with reference to the block diagram of FIG. 1, the flowchart of FIG. 3, and substrate cross-sectional views of FIG. 6.

A cassette holding substrates G is transferred from the etching apparatus 52 to the cassette station 2 of the reflow pattern forming apparatus 1. The arm 4 disposed in the substrate transfer unit 4 takes a substrate G out of the cassette and transfers it to the remover unit 5. The resist film 206 formed on the substrate G has the first pattern for the etching process which was performed in the etching apparatus 52. Note that the substrate G has been subjected to a half exposure process in the exposure apparatus 51, and thus the resist film 206 has thin portions which are to be removed before the reflow process, and thick portions which are to remain and to be subjected to the reflow process, as shown in FIG. 6(a).

In the remover unit 5, as shown in FIG. 10(b), the substrate G is subjected to a pre-treatment, i.e., an etching process that removes an altered layer formed in the surface region of the resist (photoresist) film 206 by exposing the altered layer to an alkaline solution (step S1 in FIG. 3).

Then, the substrate G is transferred to the re-developing unit 6 by means of the arm in the substrate transfer unit 4. In the re-developing unit 6, the substrate G is subjected to a re-developing process that removes unnecessary thin portions of the resist film 206, and thus only the thick portions of the resist film 206 remain on the substrate G, as shown in FIG. 6(d) (step S2 in FIG. 3). That is, the resist film 206 remains on the areas to be masked near targets Tg.

Then, the substrate G is transferred, by means of the arm in the substrate transfer unit 4, to the thermal treatment unit 6, in which the substrate G is subjected to a predetermined temperature-adjusting treatment, i.e., a heating treatment and a cooling treatment. Then, the substrate G is transferred, by means of the arm in the substrate transfer unit 4, to the reflow unit 7 in which the substrate G is subjected to a reflow process that dissolves and deforms the resist film 206 for a predetermined period of time, thereby the resist film 206 is reshaped into a second pattern that masks the targets G (step S3 in FIG. 3).

Then, the substrate G is transferred, by means of the arm in the substrate transfer unit 4, to the thermal treatment unit 6, in which the substrate G is heated so that the resist film 206 of the second pattern is fixed. Then, the substrate G is returned, by means of the arm in the substrate transfer unit 4, to a cassette placed on the cassette station 2. Thereafter, the cassette holding the substrates G having been subjected to the above series of processes in the reflow pattern forming apparatus 1 is transferred to the etching apparatus 52, in which each substrates G are subjected to the second etching process.

Next, the reflow process in the first embodiment will be described in detail with reference to the cross-sectional view of the reflow unit 7 of FIG. 2, a flowchart showing process steps of the reflow process of FIG. 4

First, the substrate G is placed on the temperature adjusting plate 11, and the temperature of the substrate support surface of the temperature adjusting plate 11 is adjusted to a predetermined value (e.g., 24° C.) by means of the temperature regulator 13. The upper part 10b of the processing chamber 10 sealingly engages with the bottom part 10a to form a closed processing space in the processing chamber 10. Then, a thinner vapor-containing gas whose concentration is adjusted to a predetermined value by the gas concentration adjusting device 17 is supplied into the processing chamber 10 so as to start the reflow process (Step 31 in FIG. 4).

After starting the reflow process, the atmospheric temperature sensor 23 detects the atmospheric temperature in the processing chamber 10, and sends the detection signal to the control unit 24. The control unit 24 compares the atmospheric temperature sent from the atmospheric temperature sensor 23 with the set temperature of the substrate support surface of temperature adjusting plate 11 (i.e., the target temperature which is now being set in the temperature regulator 13) (Step S33 in FIG. 4).

Figure 4:
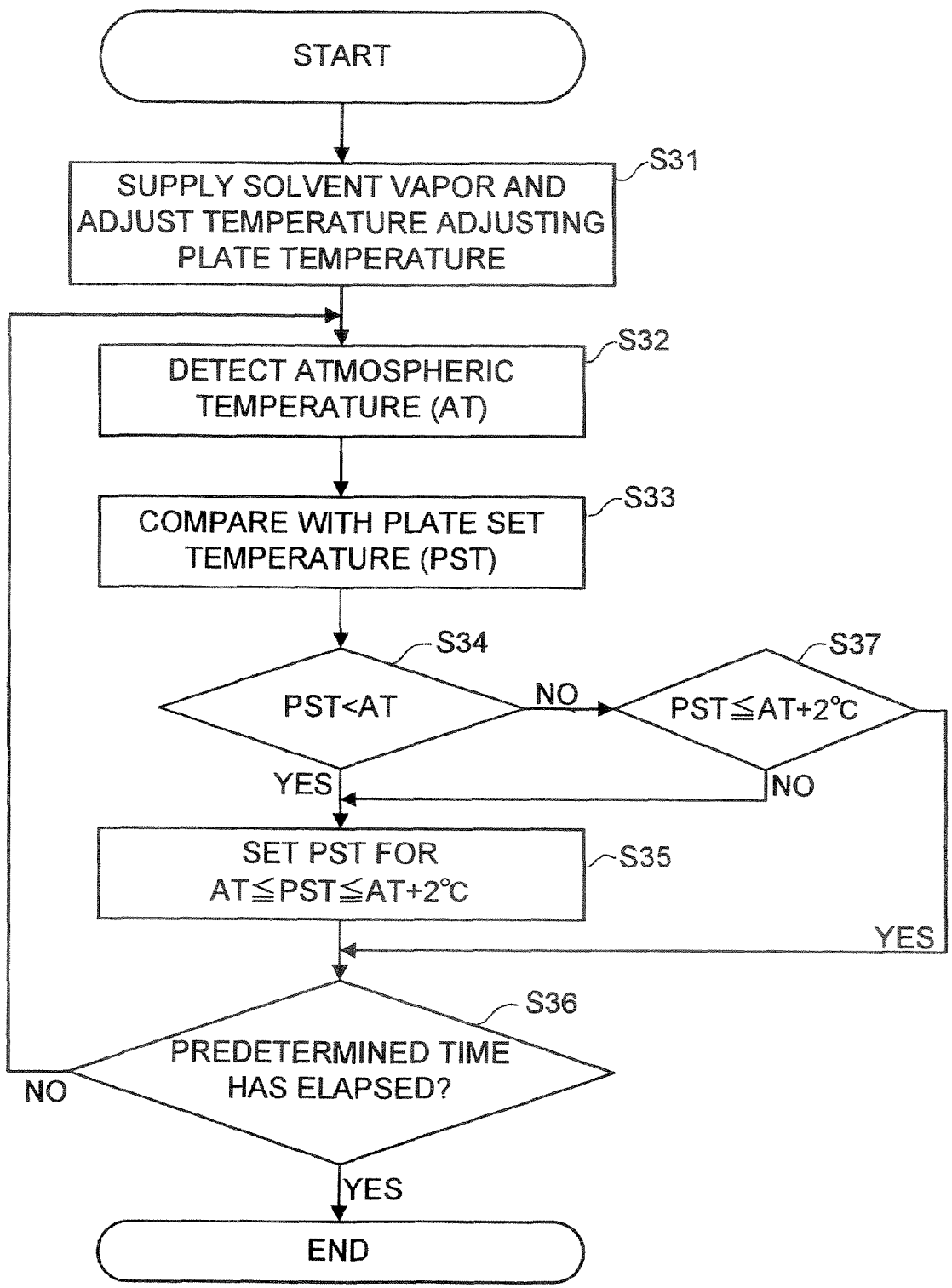
FIG. 4 is a flowchart showing process steps performed in the reflow unit of FIG. 2 in one embodiment of the present invention.

If the detected atmospheric temperature is lower than the set temperature of the temperature adjusting plate 11, the control unit 24 changes the set temperature such that the set temperature meets the requirement "Atmospheric Temperature≦Set Temperature≦(Atmospheric Temperature+2° C.)" (Steps S34 and S35 in FIG. 4).

If the detected atmospheric temperature is higher than the set temperature of the temperature adjusting plate 11, the control unit 24 judges whether the set temperature is not more than "atmospheric temperature+2° C" (Steps S34 and S37 in FIG. 4). If NO, the control unit 24 changes the set temperature such that the set temperature meets the requirement "Atmospheric Temperature≦Set Temperature≦(Atmospheric Temperature+2° C.)" (Step S35 in FIG. 4).

Thereafter, the control unit 24 judges whether the predetermined process time defined by the process recipe has elapsed (Step S36 in FIG. 4). If No, the routine returns back to Step 32 and continues until the predetermined process time elapses.

According to the foregoing embodiment, as the reflow process is performed while maintaining the specific relationship between the set temperature and the atmospheric temperature, i.e., "Atmospheric Temperature≦Set Temperature≦(Atmospheric Temperature+2° C.)" by controlling the set temperature, reflowing of the resist can be performed stably, while achieving a satisfactory reflow rate of the resist (i.e., the amount of diffusion of the resist) although it is somewhat low and thus suppressing the reduction in the production efficiency, as previously described in the Summary of the Invention part.

In the foregoing embodiment, the reflow unit 7 shown in FIG. 2 is configured so that the thinner vapor-containing gas supplied into the processing chamber 10 is not subjected to temperature adjustment. However, the configuration of the reflow unit is not limited to that in the foregoing embodiment. The reflow unit may be configured so that the temperature of the thinner gas can be adjusted according to the set temperature of the temperature adjusting plate 11, and may be configured as shown in FIG. 5.

Figure 5:
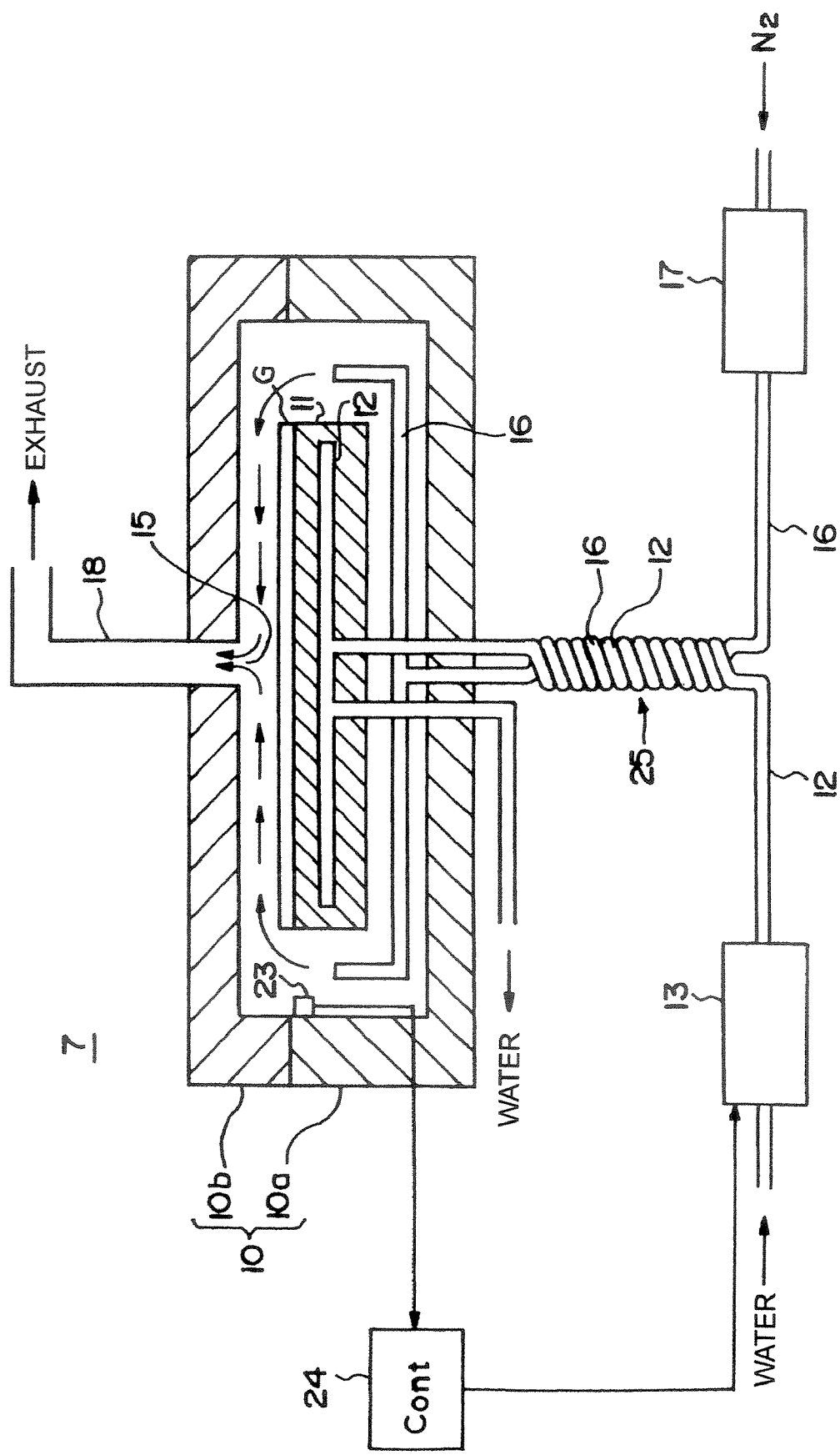
FIG. 5 is a cross-sectional view schematically showing the structure of a reflow unit in another embodiment of the present invention.

Referring to FIG. 5, the temperature adjusting water path 12 and the gas supply pipe 16 have respective spiral portions 25 which are entwined with each other. The thinner vapor-containing gas is supplied into the processing chamber 10 from the bottom portion thereof to flow upward. The thinner vapor-containing gas is heated at its spiral portion 25 by the temperature adjusting water so that the temperature of the thinner vapor-containing gas becomes close to the temperature of the temperature adjusting water, and thereafter is supplied into the chamber 10. If the atmospheric temperature detected by the atmospheric temperature sensor 23 is lower than the set temperature of the temperature adjusting water, the thinner vapor-containing gas supplied from the concentration adjusting device 17 passes through the spiral portion 25 where the temperature of the thinner vapor-containing gas raises to a temperature slightly lower (the difference is not more than 2° C.) than the temperature adjusting water. On the contrary, if the atmospheric temperature detected by the atmospheric temperature sensor 23 is higher than the set temperature of the temperature adjusting water, the set temperature of the temperature adjusting water is reset to a temperature higher than the atmospheric temperature. Accordingly, this configuration has the advantage that the temperature of the temperature adjusting plate 11 may be set to a desired value higher than the original atmospheric temperature.

The invention claimed is:

1. A substrate processing method comprising:
providing a substrate provided thereon with a photoresist film including a first pattern
placing the substrate on a substrate supporting surface of a temperature adjusting plate disposed in a processing chamber;
adjusting an actual temperature of the substrate supporting surface to coincide with a target temperature of the substrate supporting surface;
supplying an atmosphere containing a solvent including an ability to dissolve a photoresist film, thereby dissolving and deforming the photoresist film including the first pattern to reshape the photoresist film into a second pattern; and
performing feedback control of the target temperature of the substrate supporting surface, during reshaping of the photoresist film,
wherein the feedback control of the target temperature includes
detecting an atmospheric temperature in the processing chamber,
comparing the target temperature which is being set at that time with the atmospheric temperature thus detected, and
determining the target temperature based on a comparison result such that the target temperature satisfies a condition defined as the atmospheric temperature≦the target temperature≦(the atmospheric temperature+2° C.).

* * * * *